United States Patent [19]

Schröder-Brumloop et al.

[11] Patent Number: 5,491,405
[45] Date of Patent: Feb. 13, 1996

[54] LEVEL CONVERSION OF AC OR DC VOLTAGE WITH NOISE REJECTION AND LOW POWER CONSUMPTION

[75] Inventors: Helmut L. Schröder-Brumloop; Andreas O. F. Belkner, both of Berlin, Germany

[73] Assignee: Otis Elevator Company, Farmington, Conn.

[21] Appl. No.: 282,410

[22] Filed: Jul. 28, 1994

Related U.S. Application Data

[63] Continuation of Ser. No. 984,781, Dec. 3, 1992, abandoned.
[51] Int. Cl.[6] ............................................ G05F 5/00
[52] U.S. Cl. ........................ 323/299; 323/273; 323/902
[58] Field of Search ................................ 363/59, 60, 62, 363/15, 123; 323/902, 299, 273

[56] References Cited

U.S. PATENT DOCUMENTS

| 4,394,613 | 7/1983 | Cole | 320/48 |
| 4,962,292 | 10/1990 | Aoki | 219/10.55 B |
| 5,089,948 | 2/1992 | Brown et al. | 363/58 |
| 5,124,630 | 6/1992 | Tsutsumi | 323/299 |

Primary Examiner—Peter S. Wong
Assistant Examiner—Adolf Berhane

[57] ABSTRACT

An input voltage $U_{IN}$ to a voltage level converter 10 having a high input impedance charges a storage element which periodically discharges current to an LED 16 which periodically provides a light pulse for generating a level converted version of the input voltage $U_{IN}$. A resistor $R_p$ 22 connected to the storage element allows the storage element to discharge noise voltage spikes in the input voltage $U_{IN}$.

8 Claims, 2 Drawing Sheets

LEVEL CONVERSION OF AC OR DC VOLTAGE WITH NOISE REJECTION AND LOW POWER CONSUMPTION

This is a continuation of copending application Ser. No. 07/984,781, filed on Dec. 3, 1992, now abandoned.

TECHNICAL FIELD

The present invention relates to input voltage level conversion so as to minimize power consumed and in such manner that noise in the input voltage is eliminated.

BACKGROUND OF THE INVENTION

It is common for a receiver in an elevator system to employ a voltage level converter for converting the voltage of a transmitted signal to a level suitable to circuitry connected to the receiver.

A large amount of noise is inherent in the transmission and reception of electric signals in an elevator system due to the use of many electric and electronic components which have a wide range of voltage and current requirements. To deal with noise caused by short circuits and ground loops in the wiring of the elevator system, it is common to use a voltage level converter which includes an optical coupler. In other words, an input voltage is converted to an optical signal when a current through an LED of a primary side of the optical coupler. The secondary side of the optical coupler, electrically insulated from the primary side and faulty wiring connected to it, receives optical signals and a voltage signal resembling the input voltage is reconstructed from it. The voltage across the LED is reduced by placing a power resistor in series with the optical coupler.

One way to deal with induced or capacitive coupled noise is to lower the input impedance of the voltage level converter by decreasing the resistor value, thereby increasing the current needed to turn on the LED of the optical coupler. This is a self-defeating solution to the noise problem because of the high power consumption of the voltage level converter caused by a high current needed for LED turn-on. Further, the expense of a power resistor capable of enduring high currents makes this voltage level converter unattractive from a cost standpoint. The voltage level converter is unattractive from a manufacturing standpoint because the size of such a power resistor makes the voltage level converter unsuitable for surface mounting.

DISCLOSURE OF THE INVENTION

Objects of the present invention include converting the level of an input voltage, and at the same time reducing noise in the input signal, with a minimum of power consumed in the process.

According to the present invention, an input voltage to a voltage level converter having a high input impedance charges a storage element which discharges current to an LED which provides a light pulse for generating a level converted version of the input voltage. In further accord with the present invention, a resistor connected to the storage element allows the storage element to discharge noise spikes in the input voltage.

Advantages of the present invention include (a) a voltage level converter with high input impedance and therefore low power consumption due to pulsed operation of the optical coupler and (b) reduced noise due to the resistor connected to the storage element.

BEST MODE FOR CARRYING OUT THE INVENTION

Figure 1:
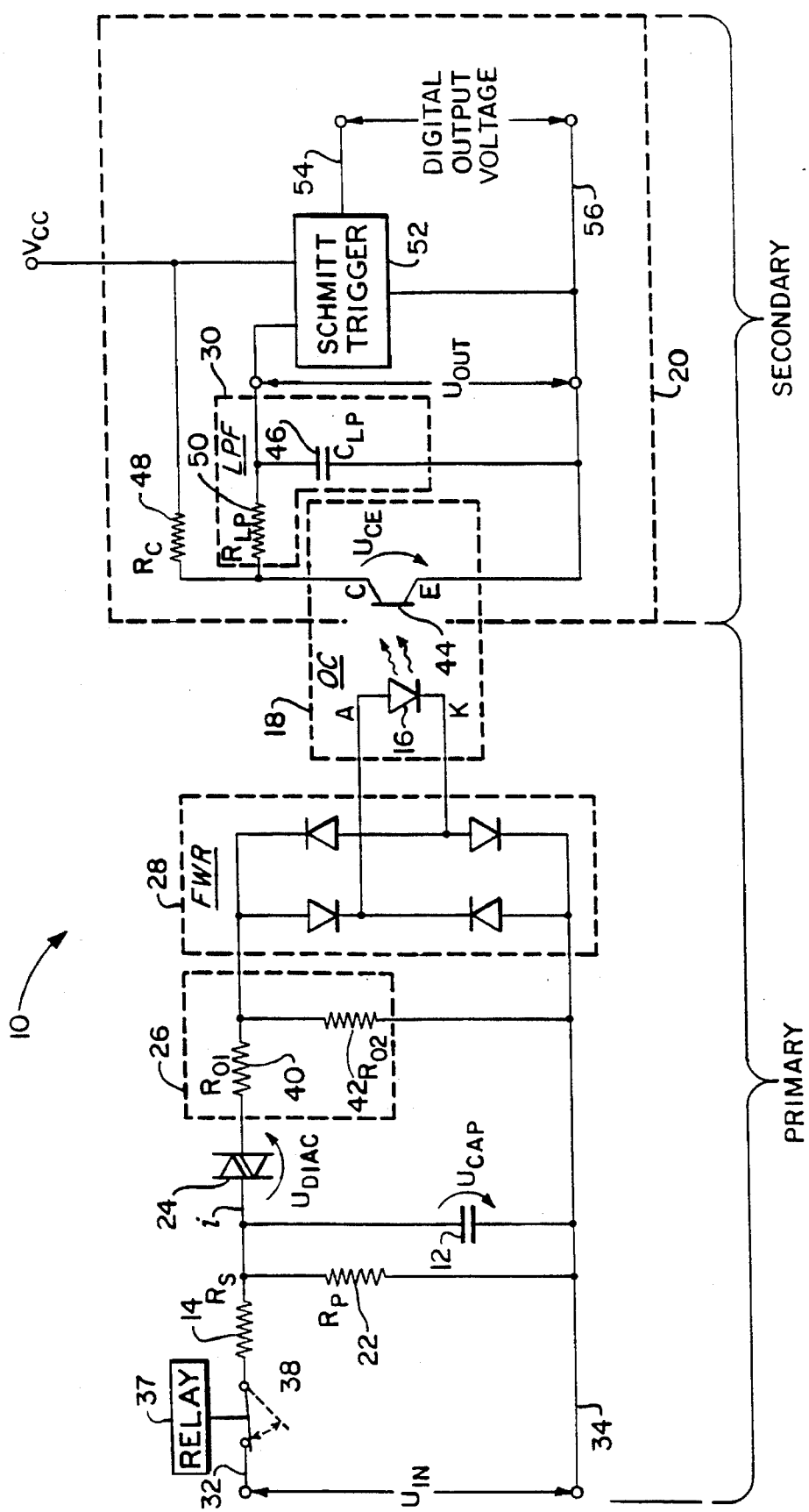
FIG. 1 is a circuit diagram of a voltage level converter.

FIG. 1 shows a voltage level converter 10 which essentially includes (a) a capacitor 12 charged through a resistor $R_S$ 14 by an input voltage $U_{IN}$, (b) a light emitting diode (LED) 16 of an optical coupler 18 which provides a light pulse each time the capacitor 12 discharges, and (c) a light sensitive monostable multivibrator 20 which provides a digital output voltage in response to the light pulse. The pulsed operation of the optical coupler 18 allows the voltage level conversion process to consume minimal power.

The primary side of the voltage level converter 10 includes three additional components for accomplishing three additional ends: (a) a resistor $R_p$ 22 allows noise spikes in the input voltage $U_{IN}$ which charge the capacitor 12 to discharge through the resistor $R_p$ 22, (b) a voltage controlled switch in the form of a DIAC 24 and a voltage divider 26 (see resistor above) for limiting the voltage applied across the LED 16, (c) a full wave rectifier 28 so that the voltage level converter 10 can convert levels of both AC and DC voltages. The secondary side of the voltage level converter 10 includes, within the monostable multivibrator 20, a low pass filter 30 for rejecting high frequency portions of the input voltage $U_{IN}$, such as noise spikes.

In detail, FIG. 1 shows the input voltage $U_{IN}$ applied across input terminals 32, 34 for charging the capacitor 12 through the resistor $R_S$ 14, thereby building up a voltage $U_{CAP}$ across the capacitor 12.

If the input voltage $U_{IN}$ consists of a short noise spike, that short noise spike will charge the capacitor 12 and be discharged through the resistor $R_p$ 22 and therefore not contribute to the turn-on of the LED 16. A noise spike could never discharge through $R_S$ 14 because the resistor $R_S$ 14 is always connected to either the input voltage $U_{IN}$ or nothing; the input voltage $U_{IN}$ is applied to the voltage level converter 10 because a relay 37 picked up, thereby closing a relay contact 38.

If the input voltage $U_{IN}$ is longer than a short noise spike, the capacitor 12 charges and periodically discharges a current i to the DIAC 24, periodically causing turn-on of the LED 16.

The voltage level converter 10 includes the voltage controlled switch in the form of the DIAC 24 for providing current i to voltage divider 26 including a resistor $R_{01}$ 40 and a resistor $R_{02}$ 42; the DIAC 24 and voltage divider 26 together function to limit the voltage applied to the LED 16 because most cheap commercially available DIACs have output voltages that do not match the voltage required for turn-on of the LED 16.

The DIAC 24 is responsible for the oscillation of the circuit and the pulsing of the LED 16. Because the DIAC 24 switches on at a voltage threshold close to the LED turn-on voltage threshold and switches off in response to the discharge from the capacitor 12, the DIAC 24 together with capacitor 12 and resistor $R_S$ 14 forms a multivibrator.

The voltage level converter 10 includes the full wave rectifier 28 for ensuring that an AC or DC voltage $U_{IN}$ can turn on the LED 16.

In response to the current i discharged from the capacitor 12, the LED 16 periodically provides a light pulse to a light sensitive switch 44 of the monostable multivibrator circuit 20 so that a current is conducted from collector C to emitter E. The rate at which the LED 16 provides light pulses to the light sensitive switch 44 is a function of the rate of charging and discharging of the capacitor 12. When the light sensitive switch 44 is not turned on, voltage source $V_{CC}$ charges a capacitor $C_{LP}$ 46 of low pass filter 30 through a resistor $R_C$ 48 and a resistor $R_{LP}$ 50 of the low pass filter 30. When the light sensitive switch 44 is turned on, the capacitor $C_{LP}$ 46 discharges through the resistor $R_{LP}$ 50 alone. The voltage level converter 10 includes the low pass filter 30 to eliminate the high frequency portion of the collector-emitter voltage $U_{CE}$ so that a short pulse in the input voltage $U_{IN}$, such as a noise spike, is not passed through voltage level converter 10.

An output voltage $U_{OUT}$ provided from low pass filter 30 is provided to a Schmitt trigger 52 for providing a digital output voltage across lines 54, 56. Hysteresis in the Schmitt trigger 52 ensures that a high digital output is provided when the output voltage $U_{OUT}$ dips below a low level and the digital output remains high until the output voltage $U_{OUT}$ again exceeds a high level.

Figure 2:
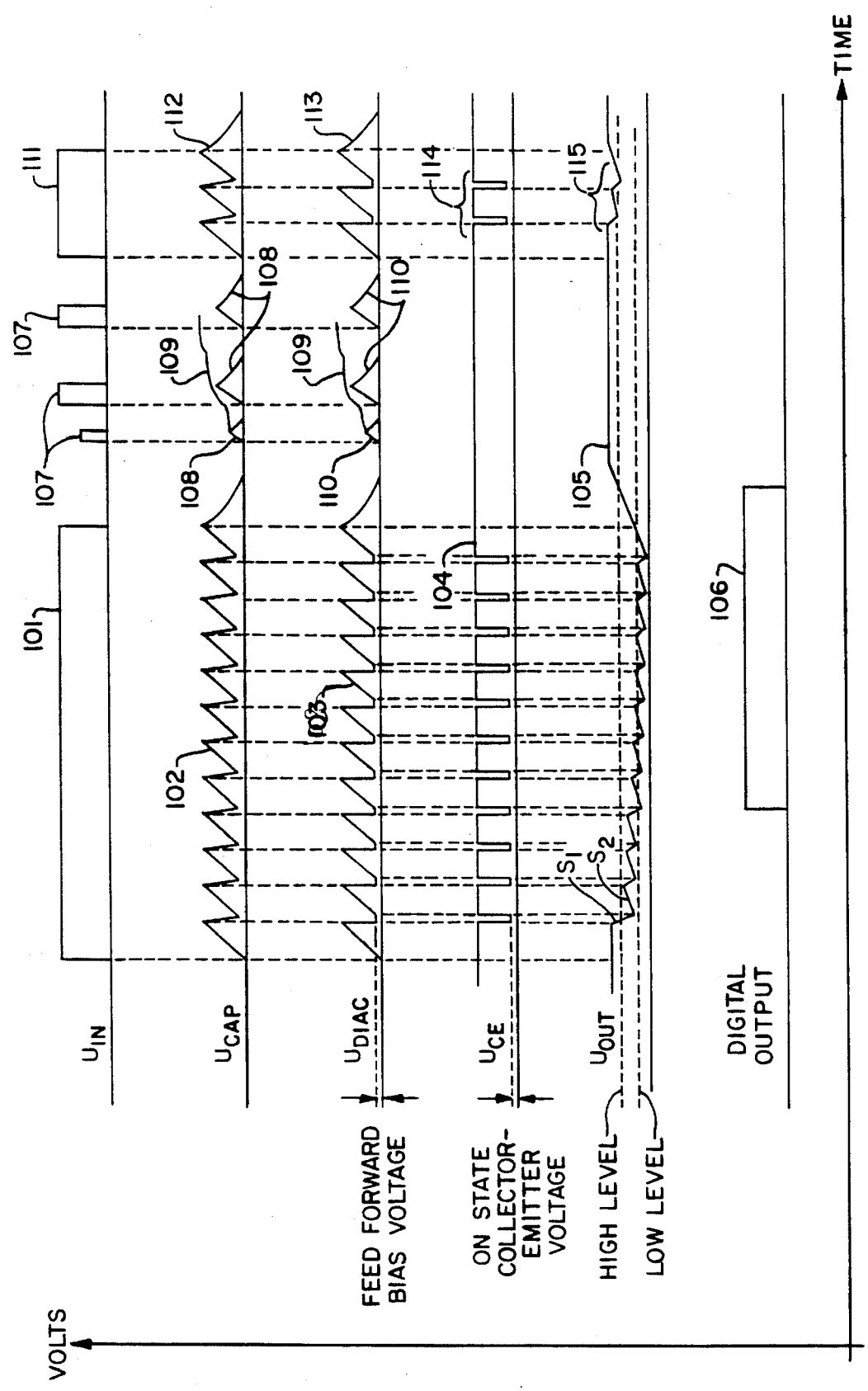
FIG. 2 is a timing diagram of voltages in the voltage level converter illustrated in FIG. 1.

FIG. 2 shows, on a common time line, voltages in the voltage level converter 10 of FIG. 1. A DC voltage $U_{IN}$, waveform 101, is applied across the capacitor 12 (FIG. 1) for charging it. Charging and discharging of capacitor 12 is shown in the voltage $U_{CAP}$, waveform 102. The current discharged periodically from the capacitor 12 generates a voltage $U_{DIAC}$, waveform 103, across the DIAC 24. The voltage $U_{DIAC}$, waveform 103, is equal to the voltage across the capacitor 12 $U_{CAP}$, waveform 102, except when the LED 16 (FIG. 1) is providing a light pulse, at which time the voltage $U_{DIAC}$, waveform 103, is equal to the feed forward bias voltage of the DIAC 24 (FIG. 1). The energy originally stored in the capacitor 12 causes light pulses to be provided from the LED 16 which are sensed by the light sensitive switch 44 which in turn provides a collector-emitter voltage $U_{CE}$, waveform 104. The collector-emitter voltage $U_{CE}$, waveform 104, remains at a high value except when the light-sensitive switch 44 is turned on, at which point the collector-emitter $U_{CE}$, waveform 104, drops to an on-state collector-emitter voltage level for the light sensitive switch 44. This collector-emitter voltage $U_{CE}$, waveform 104, is applied across the low pass filter (LPF) 30 which rejects high frequency signals in $U_{CE}$, waveform 104, usually represented by single noise pulses. An output voltage $U_{OUT}$, waveform 105, is provided from the low pass filter 30. The output signal $U_{OUT}$, waveform 105, is at a constant level when the capacitor $C_{LP}$ 46 is charged and the light sensitive switch 44 is off; then the output signal $U_{OUT}$ dips along a first slope $S_1$ as the capacitor $C_{LP}$ 46 discharges through the resistor $R_{LP}$ 50 and next rises slightly along a second slope $S_2$ as the capacitor $C_{LP}$ 46 charges through the resistor $R_C$ 48 and the resistor $R_{LP}$ 50 when the light sensitive switch 44 is off. Through repeated charging and discharging, the output voltage $U_{OUT}$, waveform 105, dips first below a high level and then a low level. At the end of the pulse train of the collector-emitter voltage $U_{CE}$, waveform 104, the output voltage $U_{OUT}$, waveform 105, rises back to its initial value as the capacitor $C_{LP}$ 46 charges without a consequent discharge in response to turn-on of the light sensitive switch 44. The output voltage $U_{OUT}$, waveform 105, is provided from the low pass filter 30 to the Schmitt trigger 52 which produces the digital output voltage, waveform 106, across lines 54, 56. The Schmitt trigger 52 produces a high output so long as the output voltage $U_{OUT}$, waveform 105, has fallen below a low level and has not yet risen from that low level to a high level.

Looking to FIG. 2 again, noise spikes, waveform 107, are shown included in the graph of the input voltage $U_{IN}$, waveform 101. The capacitor voltage $U_{CAP}$, waveform 102, includes noise spikes, waveform 108, because of the capacitor-charging effect of the noise spikes, waveform 107.

Without the resistor $R_p$ 26, the noise spikes, waveform 107, would charge the capacitor 12 (FIG. 1) and therefore the capacitor voltage $U_{CAP}$ would increase with each noise spike, waveform 107. That is, without the resistor $R_p$ 26, the voltage $U_{CAP}$ across the capacitor 12 from successive noise spikes, waveform 107, could add up to cause turn-on of the LED 16. The additive effect of successive noise spikes is shown in waveform 109 for the capacitor voltage $U_{CAP}$ and the DIAC voltage $U_{DIAC}$. Because of $R_p$ 26, the noise spikes, waveform 107, appear as voltages, waveform 9, that rise and fall without any additive effect on the output of the voltage level converter 111.

These short noise spikes, waveform 107, charge the capacitor 12 and are discharged. The voltage $U_{CAP}$, waveform 102, is equal to the DIAC voltage $U_{DIAC}$, waveform 103, except when the LED 16 provides a light pulse. And the LED 16 is never turned on by short noise spikes, waveform 107, because they are not long enough to charge the capacitor 12 enough to generate the break over voltage of the DIAC 34.

If, however, a noise spike, waveform 111, is long enough, then that noise spike, waveform 111, will appear in the capacitor voltage $U_{CAP}$, waveform 102, as capacitive noise voltage, waveform 117, and therefore appear across the DIAC 24, waveform 113. This DIAC noise voltage, waveform 113, will cause the turn-on of the LED 16, a consequent collector-emitter noise voltage, subwaveform 114, across the collector-emitter of the light sensitive switch 44; then an output noise voltage, waveform 115, in the output voltage $U_{OUT}$, waveform 5. However, no noise voltage is provided in the digital output voltage, waveform 107. Due to the low pass filter 30 collector-emitter noise voltage, subwaveform 114, drops the output voltage $U_{OUT}$, waveform 105, below the high level but not the low level, and therefore the Schmitt trigger 52 (FIG. 1) never provides noise in the digital output voltage waveform 106.

Although the invention has been shown and described with regard to a particular embodiment, various changes in the above description may be made without departing from the scope and spirit of the present invention.

We claim:

1. A voltage level converter circuit for converting input signals having one voltage level into output signals having another voltage level, said voltage level converter circuit comprising an optical coupler having a primary circuit electrically isolated from a secondary circuit:

A) said primary circuit including
      an oscillating circuit, responsive to said input signals having an input voltage waveform and said one voltage level, for providing pulsed input voltage signals, and
      a light emitting means, responsive to said pulsed input voltage signals, for providing pulsed light signals; and B) said secondary circuit including means, responsive to said pulsed light signals, for providing said output signals having an output voltage waveform substantially similar to the input voltage waveform, whereby the voltage level converter circuit has a pulsed operation for consuming a reduced amount of power during voltage level conversion.

2. A voltage level converter circuit according to claim 1, wherein said primary circuit further includes a low pass filter, responsive to said input signals having high frequency electrical components caused by noise for providing said pulsed input voltage signals without said high frequency electrical components caused by noise.

3. A voltage level converter circuit according to claim 1, wherein said secondary circuit includes a light sensitive switch, responsive to said pulsed light signals, for providing a collector-emitter voltage signal, and further includes a low pass filter, responsive to said collector-emitter voltage signal, for providing said output signals with only low frequency portions of said collector-emitter voltage.

4. A voltage level converter circuit according to claim 1, wherein said oscillating circuit includes a capacitor having a stored voltage and a voltage controlled switch, responsive to said stored voltage, for providing said pulsed input voltage signals.

5. A voltage level converter circuit according to claim 4, wherein said voltage controlled switch includes a DIAC and a voltage divider for limiting a voltage level of said pulsed input voltage signals.

6. A voltage level converter circuit according to claim 1, wherein said primary circuit further includes a full wave rectifier for converting said pulsed input voltage signals.

7. A voltage level converter circuit according to claim 2, wherein the low-pass filter includes a capacitor $U_{CAP}$ and a resistor $R_p$.

8. A voltage level converter circuit according to claim 3, wherein said low pass filter includes a capacitor $C_{LP}$ and a resistor $R_{LP}$.

* * * * *